(12) United States Patent
Naniwa et al.

(10) Patent No.: US 11,463,050 B2
(45) Date of Patent: Oct. 4, 2022

(54) RADIO FREQUENCY CIRCUIT AND COMMUNICATION APPARATUS

(71) Applicant: Murata Manufacturing Co., Ltd., Kyoto (JP)

(72) Inventors: Yusuke Naniwa, Kyoto (JP); Hideki Muto, Kyoto (JP); Hiroshi Nishikawa, Kyoto (JP); Takashi Watanabe, Kyoto (JP); Akiko Itabashi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 174 days.

(21) Appl. No.: 16/832,295

(22) Filed: Mar. 27, 2020

(65) Prior Publication Data

US 2020/0228074 A1 Jul. 16, 2020

Related U.S. Application Data

(63) Continuation of application No. PCT/JP2018/035297, filed on Sep. 25, 2018.

(30) Foreign Application Priority Data

Sep. 29, 2017 (JP) .............................. JP2017-192117
Mar. 2, 2018 (JP) .............................. JP2018-037779

(51) Int. Cl.
*H03F 3/187* (2006.01)
*H03F 3/195* (2006.01)
(Continued)

(52) U.S. Cl.
CPC ............. *H03F 3/195* (2013.01); *H04B 1/406* (2013.01); *H05K 1/165* (2013.01)

(58) Field of Classification Search
CPC ......................................................... H03F 3/187
(Continued)

(56) References Cited

U.S. PATENT DOCUMENTS 10,621,893 B2 * 4/2020 Araki ..................... G09F 9/301
2011/0037170 A1 2/2011 Shinohara
(Continued)

FOREIGN PATENT DOCUMENTS

JP  2003188626 A  7/2003
JP  2009182278 A  8/2009
(Continued)

OTHER PUBLICATIONS

International Search Report issued in Application No. PCT/JP2018/035297, dated Dec. 4, 2018.
(Continued)

*Primary Examiner* — Henry Choe
(74) *Attorney, Agent, or Firm* — Pearne & Gordon LLP

(57) ABSTRACT

A radio frequency circuit includes a substrate, a first terminal disposed on a first principal surface of the substrate, a second terminal disposed on the first principal surface, a first-surface mounted component disposed on the first principal surface or inside the substrate, and a second-surface mounted component disposed on a second principal surface of the substrate which is opposite the first principal surface. A radio-frequency signal, which is input to the first terminal, is transmitted, for output from the second terminal, so as to make at least one round trip between the first principal surface and the second-surface mounted component, which is disposed on the second principal surface, through wiring lines disposed in the substrate.

20 Claims, 6 Drawing Sheets

(51) Int. Cl.
*H04B 1/403* (2015.01)
*H05K 1/16* (2006.01)
(58) Field of Classification Search
USPC .................................. 330/307, 66
See application file for complete search history.

(56) References Cited

U.S. PATENT DOCUMENTS

| | | |
|---|---|---|
| 2014/0308906 A1 | 10/2014 | Saji et al. |
| 2014/0349720 A1 | 11/2014 | Uejima et al. |
| 2015/0179621 A1 | 6/2015 | Matsumoto et al. |
| 2016/0231783 A1* | 8/2016 | Raff ..................... G06F 1/1652 |
| 2017/0092630 A1* | 3/2017 | Weis ....................... H01L 24/17 |
| 2017/0264337 A1 | 9/2017 | Kogure et al. |
| 2018/0190601 A1 | 7/2018 | Hitomi et al. |
| 2018/0211582 A1* | 7/2018 | Sakariya .................. G09G 3/32 |
| 2019/0362655 A1* | 11/2019 | Araki .................. H01L 27/3276 |

FOREIGN PATENT DOCUMENTS

| | | |
|---|---|---|
| JP | 2011040602 A | 2/2011 |
| JP | 2014207517 A | 10/2014 |
| JP | 5773082 B2 | 9/2015 |
| WO | 2013125363 A1 | 8/2013 |
| WO | 2016104011 A1 | 6/2016 |
| WO | 2017033564 A1 | 3/2017 |

OTHER PUBLICATIONS

Written Opinion issued in Application No. PCT/JP2018/035297, dated Dec. 4, 2018.

\* cited by examiner

RADIO FREQUENCY CIRCUIT AND COMMUNICATION APPARATUS

This is a continuation of International Application No. PCT/JP2018/035297 filed on Sep. 25, 2018 which claims priority from Japanese Patent Application No. 2017-192117 filed on Sep. 29, 2017, and claims priority from Japanese Patent Application No. 2018-037779 filed on Mar. 2, 2018. The contents of these applications are incorporated herein by reference in their entireties.

BACKGROUND

Technical Field

The present disclosure relates to a radio frequency circuit and a communication apparatus.

In recent years, high integration of components mounted on a radio frequency circuit such as a front-end module has progressed. For example, a radio frequency circuit is disclosed in which components formed on a semiconductor substrate, ceramic multilayer chip components, and the like are mounted on both the surfaces of a wiring board such as a printed circuit board (for example, see Patent Document 1).

Patent Document 1: Japanese Patent No. 5773082

BRIEF SUMMARY

There has been a demand that recent mobile communication devices and the like be compatible with multiple frequencies and wireless systems in a single terminal, that is, be made multiband and multimode. A radio frequency circuit that is compatible with being multiband and multimode is required to process multiple radio-frequency signals without necessarily degradation in quality. For example, the isolation characteristics between paths, through which the multiple radio-frequency signals are transmitted, are required to be further improved, and the path loss is required to be further suppressed.

The present disclosure provides a radio frequency circuit and a communication apparatus which may achieve improvement of the isolation characteristics and suppression of the path loss at the same time.

A radio frequency circuit according to one aspect of the present disclosure includes a substrate, a first terminal that is disposed on a first principal surface of the substrate, a second terminal that is disposed on the first principal surface, a first-surface mounted component that is disposed on the first principal surface or inside the substrate, and a second-surface mounted component that is disposed on a second principal surface of the substrate. The second principal surface is opposite the first principal surface. A radio-frequency signal which is input to the first terminal is transmitted from the first principal surface to the second-surface mounted component through a wiring line disposed in the substrate. The second-surface mounted component is disposed on the second principal surface. The radio-frequency signal is further transmitted, for output from the second terminal, to the first principal surface through a wiring line disposed in the substrate.

Accordingly, a radio-frequency signal which is input to the first terminal is transmitted to the second terminal after at least one round trip between the rear surface and the front surface of the substrate. This may reduce the number of wiring lines extending in the planar direction of the substrate in the radio frequency circuit, achieving a reduction of the parasitic capacitance which occurs due to the wiring lines in the planar direction of the substrate and wiring line patterns (ground patterns) which are connected to the ground and which are embedded in the substrate. In addition, in the radio frequency circuit, the length of the wiring lines of a path from the first terminal to the second terminal may be made short compared with the case in which the wiring lines are routed on the rear surface and the front surface of the substrate. This makes it easy to do design so that the wiring lines of each radio-frequency path do not overlap those of another radio-frequency path when the substrate is viewed in plan. Thus, the radio frequency circuit may achieve improvement of the isolation characteristics and suppression of the path loss at the same time.

The radio-frequency signal may be transmitted through the first terminal, the first-surface mounted component, the second-surface mounted component, and the second terminal in this sequence.

Accordingly, in the circuit in which a radio-frequency signal is transmitted from a component on the rear surface of the substrate to a component on the front surface of the substrate, the length of the wiring lines of a path from the first terminal to the second terminal may be made short compared with the case in which the wiring lines are routed on the rear surface and the front surface of the substrate. Thus, the radio frequency circuit may achieve improvement of the isolation characteristics and suppression of the path loss at the same time.

The radio-frequency signal may be transmitted from the second-surface mounted component to the first-surface mounted component, and then to the second terminal.

Accordingly, in the circuit in which a radio-frequency signal is transmitted multiple times from a component on the rear surface of the substrate to a component on the front surface of the substrate, the length of the wiring lines of a path from the first terminal to the second terminal may be made short compared with the case in which the wiring lines are routed on the rear surface and the front surface of the substrate. Thus, the radio frequency circuit may achieve improvement of the isolation characteristics and suppression of the path loss at the same time.

The radio-frequency signal may be transmitted through the first terminal, the second-surface mounted component, and the second terminal in this sequence.

Accordingly, in the circuit in which a radio-frequency signal is transmitted to a component on the front surface of the substrate, the length of the wiring lines of a path from the first terminal to the second terminal may be made short compared with the case in which the wiring lines are routed on the rear surface and the front surface of the substrate. Thus, the radio frequency circuit may achieve improvement of the isolation characteristics and impression of the path loss at the same time.

The radio-frequency signal may be transmitted through the first terminal, the second-surface mounted component, the first-surface mounted component, and the second terminal in this sequence.

Accordingly, in the circuit in which a radio-frequency signal is transmitted from a component on the front surface of the substrate to a component on the rear surface of the substrate, the length of the wiring lines of a path from the first terminal to the second terminal may be made short compared with the case in which the wiring lines are routed on the rear surface and the front surface of the substrate. Thus, the radio frequency circuit may achieve improvement of the isolation characteristics and suppression of the path loss at the same time.

The first-surface mounted component may include an active element. The second-surface mounted component may include a first matching device connected upstream of the active element.

Accordingly, the first matching device may be connected to the active element by using a conductor (via conductor) extending through the substrate, achieving a reduction of the length of the wiring lines connecting the first matching device to the active element. Therefore, the parasitic capacitance in the wiring lines between the first matching device and the active element may be reduced, achieving further reduction in the change in phase and the influence from the wiring impedance for a radio-frequency signal which is input to the active element. Thus, the degradation in the characteristics of the amplifying circuit disposed in the active element may be further suppressed.

A ground pattern may be disposed in the substrate. The ground pattern may be disposed so as to overlap the first matching device when the substrate is viewed in plan, and may not be disposed in a space which is located in the substrate on a side of the second principal surface and whose thickness is equal to half of a thickness of the substrate.

This may result in a reduction of the parasitic capacitance which occurs between the ground pattern and a different wiring line below the first matching device connected to the active element. Therefore, the change in phase and the influence from the wiring impedance for a radio-frequency signal which is input to the active element may be reduced. Thus, degradation in the characteristics of the amplifying circuit disposed in the active element may be suppressed.

A ground pattern may be disposed in the substrate. The ground pattern may not be disposed in a space which overlaps in the first matching device when the substrate is viewed in plan. The first matching device may be connected to the active element by using a conductor in the space in plan view. The conductor extends through the substrate.

Accordingly, the first matching device connected to the active element may be disposed above the active element, enabling establishment of a connection with the shortest path between the first matching device and the active element. Thus, the change in phase and the influence from the wiring impedance for a radio-frequency signal which is input to the active element may be reduced. Therefore, degradation in the characteristics of the amplifying circuit disposed in the active element may be suppressed. In particular, in the case of a radio frequency circuit such as a multiplexer in which wiring lines for multiple bands are connected to a common point, the change in phase and the influence from the wiring impedance, which are produced to the common connection point, may be reduced, achieving suppression of degradation in the characteristics of the radio frequency circuit.

The first-surface mounted component may include a second matching device connected to at least one of the first terminal and the second terminal. The radio-frequency signal may pass successively through at least one of the first terminal and the second terminal, and through the second matching device.

Accordingly, the second matching device is connected to at least one of the first terminal and the second terminal, achieving suppression of degradation in the characteristics of a radio-frequency signal which is input to or output from the first terminal and the second terminal.

A communication apparatus according to one aspect of the present disclosure includes an RF signal processing circuit that processes a radio-frequency signal received or transmitted by an antenna device, and the radio frequency circuit having the characteristics described above. The radio frequency circuit transmits the radio-frequency signal between the antenna device and the RF signal processing circuit.

Accordingly, the radio frequency circuit and the communication apparatus, which achieves improvement of the isolation characteristics and suppression of the path loss at the same time, may be provided.

The radio frequency circuit and the communication apparatus provided by the present disclosure may achieve improvement of the isolation characteristics and suppression of the path loss at the same time.

DETAILED DESCRIPTION

Figure 1:
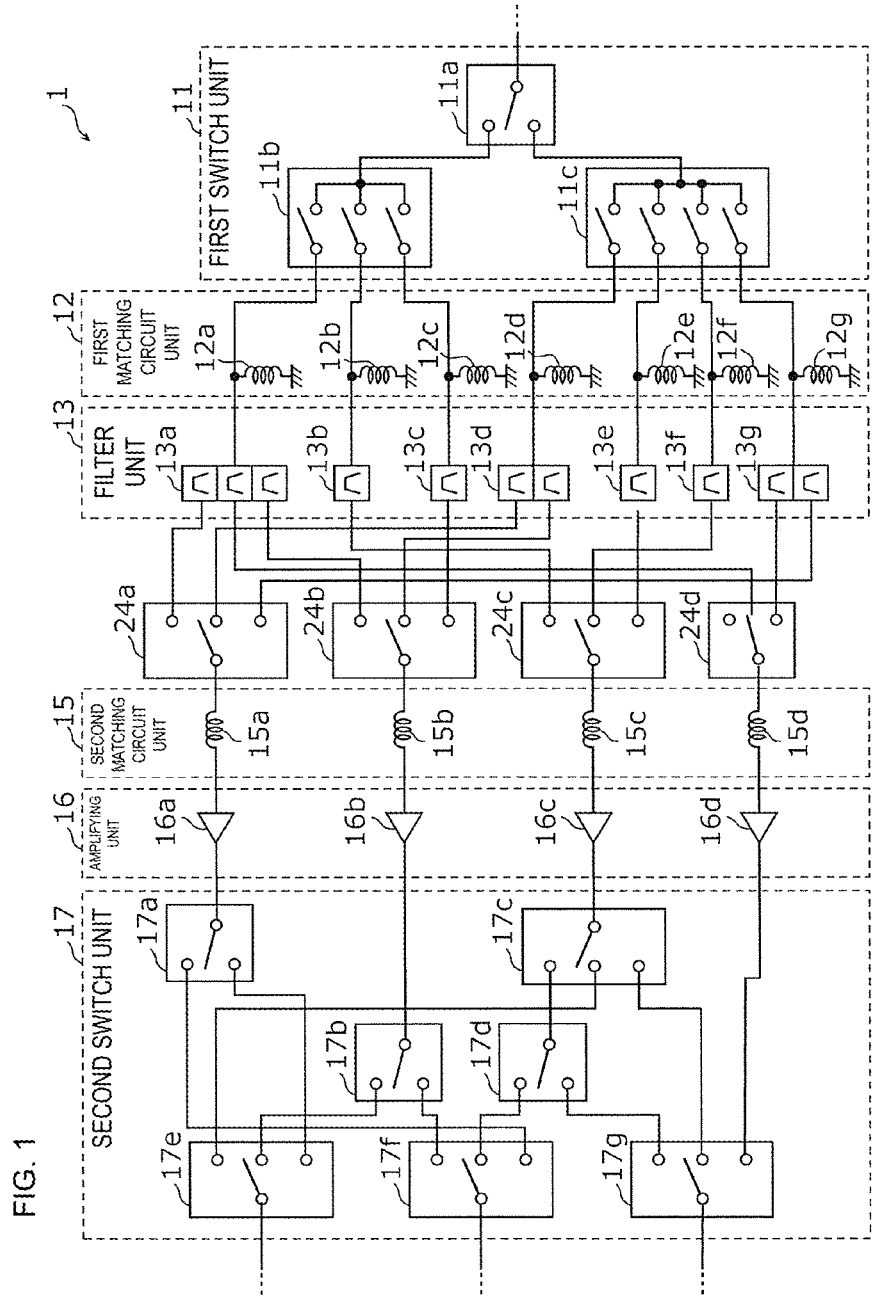
FIG. 1 is a diagram illustrating the circuit configuration of a front-end module according to a first embodiment.

Embodiments of the present disclosure will be described in detail below by using embodied examples and the drawings. All of the embodiments described below indicate comprehensive and concrete examples. The numeric values, the shapes, the materials, the components, arrangement of the components, the connection configurations, and the like, which are described in the embodiments below, are exemplary, and are not intended to limit the present disclosure. In the figures, configurations that are substantially identical are designated with identical reference characters. Repeated description may be avoided or simplified.

First Embodiment

[1. Circuit Configuration of a Front-End Module]

FIG. 1 is a diagram illustrating the circuit configuration of a front-end module 1 which is a radio frequency circuit according to a first embodiment.

The front-end module 1 is, for example, a module which is disposed in a front-end unit of a multimode/multiband cellular phone. The front-end module 1 is built, for example, in a multiband cellular phone operating in conformity with a communication standard such as LTE (Long Term Evolution). The front-end module 1 has multiple paths (radio-frequency paths) through which multiple radio-frequency signals whose frequency bands are different from each other are transmitted.

As illustrated in FIG. 1, the front-end module 1 includes a first switch unit 11, a first matching circuit unit 12, a filter unit 13, switches 14a to 14d, a second matching circuit unit 15, an amplifying unit 16, and a second switch unit 17. The first switch unit 11, the second switch unit 17, the switches 14a to 14d, and the amplifying unit 16 form a switch IC 10 which is a semiconductor device, the details of which will be described below. The switch IC 10 functions as an active element.

The multiple radio-frequency paths go through the switch IC 10, the filter unit 13, the first matching circuit unit 12, and the second matching circuit unit 15. In the switch IC 10, a radio-frequency signal flows through the first switch unit 11, the switches 14a to 14d, the amplifying unit 16, and the second switch unit 17 in this sequence. Specifically, the multiple radio-frequency paths go through the first switch unit 11, the first matching circuit unit 12, the filter unit 13, the switches 14a to 14d, the second matching circuit unit 15, the amplifying unit 16, and the second switch unit 17 in this sequence.

The first switch unit 11 has an input terminal connected, for example, to an antenna device. The output terminals of the first switch unit 11 are connected to the input terminals of the filter unit 13 through the first matching circuit unit 12. The first switch unit 11 has switches 11a to 11c which switch a radio-frequency signal, which is received by the antenna device, to a corresponding one of the radio-frequency paths for filters 13a to 13g included in the filter unit 13.

The first matching circuit unit 12 includes inductors 12a to 12g. The inductors 12a to 12g form a first matching device for performing matching between the first switch unit 11 and the filter unit 13. The inductors 12a to 12g are connected at their first ends to the respective paths connecting the switches 11a to 11c of the first switch unit 11 to the filters 13a to 13g of the filter unit 13. The inductors 12a to 12g are connected to the reference terminal (ground) at their second ends. The first matching device is not limited to the inductors 12a to 12g, and may be capacitors or circuits obtained by combining inductors and capacitors.

The filter unit 13 has the filters 13a to 13g formed, for example, of surface acoustic wave (SAW: Surface Acoustic Wave) resonators, bulk acoustic wave (BAW: Bulk Acoustic Wave) resonators, or FBARs (Film Bulk Acoustic Resonators). The filters 13a to 13g may be formed, for example, of LC resonant circuits. In this example, the filters 13a to 13g are formed of surface acoustic wave resonators. Thus, the filters 13a to 13g may be formed by using IDT (Inter Digital Transducer) electrodes formed on a piezoelectric substrate. Accordingly, the filter unit 13, which is reduced in size and profile and which has bandpass characteristics with high steepness, may be implemented. The output terminals of the filter unit 13 are connected to the input terminals of the second switch unit 17 through the switches 14a to 14d, the second matching circuit unit 15, and the amplifying unit 16.

The filter 13a is, for example, a triplexer in which a common terminal serves as the input terminals of the three filters. The filters 13d and 13g are, for example, diplexers in which a common terminal serves as the input terminals of the two filters.

The switches 14a to 14d output signals to the second matching circuit unit 15 in such a manner that the radio-frequency paths from the filters 13a to 13g are grouped. The output terminals of the switches 14a to 14d are connected to the input terminals of the second matching circuit unit 15. Specifically, the input terminals of the switches 14a to 14d are connected to the filter unit 13, and the output terminals of the switches 14a to 14d are connected to corresponding inductors 15a to 15d of the second matching circuit unit 15.

The second matching circuit unit 15 has the inductors 15a to 15d. The inductors 15a to 15d form a first matching device for performing matching between the switches 14a to 14d and the amplifying unit 16. The inductors 15a to 15d are connected, at the respective first ends, to the switches 14a to 14d, and are connected, at the respective second ends, to the amplifying unit 16. The first matching device is not limited to the inductors 15a to 15d, and, similarly to the inductors 12a to 12g described above, may be capacitors or circuits obtained by combining inductors with capacitors.

The amplifying unit 16 has amplifying circuits 16a to 16d which serve as amplifying devices, each of which amplifies a radio-frequency signal which has passed through the second matching circuit unit 15 after being grouped by the switches 14a to 14d. The amplifying circuits 16a to 16d are, for example, low noise amplifiers amplifying radio-frequency receive signals. The amplifying unit 16 is connected, at their input terminals, to the second matching circuit unit 15. The amplifying unit 16 is connected, at their output terminals, to the input terminals of the second switch unit 17. The amplifying circuits 16a to 16d are not limited to low noise amplifiers, and may be, for example, power amplifiers amplifying radio-frequency transmit signals. In the case where the amplifying circuits 16a to 16d are power amplifiers, a radio-frequency signal flows through the second switch unit 17, the amplifying unit 16, the switches 14a to 14d, the filter unit 13, the first matching circuit unit 12, and the first switch unit 11 in this sequence.

The second switch unit 17 is connected, at their output terminals, for example, to an RF signal processing circuit (RFIC). The second switch unit 17 has switches 17a to 17g which switch a radio-frequency signal, which has been amplified by the amplifying unit 16, to a given terminal of the RFIC.

A controller (not illustrated) included in the front-end module 1 switches connection in the switches 11a to 11c included in the first switch unit 11, the switches 17a to 17g included in the second switch unit 17, and the switches 14a to 14d.

The switches 11a to 11c, 14a to 14d, and 17a to 17g are, for example, FET (Field Effect Transistor) switches formed of GaAs or CMOS (Complementary Metal Oxide Semiconductor), or diode switches.

[2. Structure of the Switch IC and the Front-End Module]

Figure 2A:
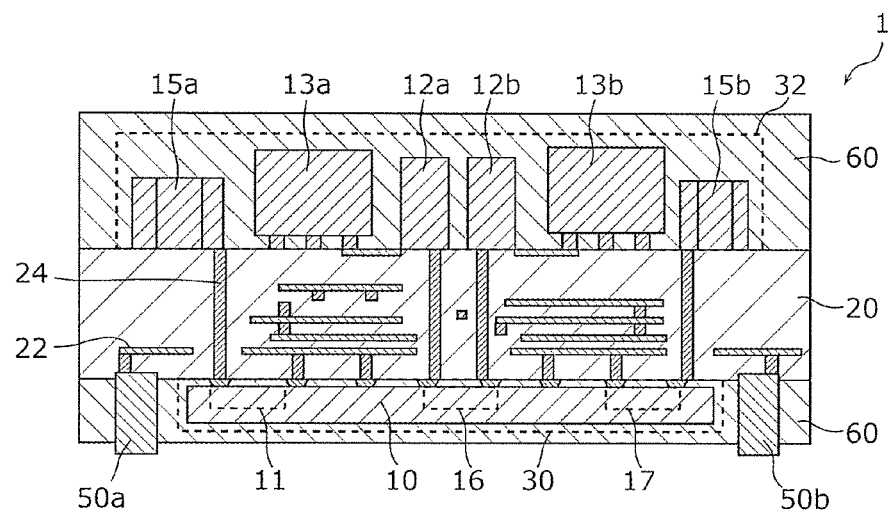
FIG. 2A is a sectional view of a front-end module according to the first embodiment.

The layout of the components of the switch IC 10 and the configuration of a first principal surface and a second principal surface of the front-end module 1 will be described below by using FIG. 2A. FIG. 2A is a sectional view of the front-end module 1 according to the first embodiment.

The first principal surface is, for example, the rear surface of a substrate 20 included in the front-end module 1. The second principal surface is the front surface of the substrate 20. The substrate 20 is, for example, a printed circuit board or an LTCC (Low Temperature Co-fired Ceramics) substrate. The substrate 20 may be a substrate having a single layer, or may be a multilayer substrate. As described below, in the substrate 20, multiple wiring lines (wiring lines 22 and via conductors 24) for connecting terminals (bumps), which are disposed on the front surface and the rear surface of the substrate 20, to each other are disposed.

On the rear surface of the substrate 20, a first-surface mounted component 30 is disposed. The first-surface mounted component 30 includes, for example, the switch IC 10, a first terminal 50a, and a second terminal 50b. The first terminal 50a serves as the input terminal of the front-end module 1, and the second terminal 50b serves as the output terminals of the front-end module 1. On the rear surface of the substrate 20, multiple terminals (not illustrated) other than the first terminal 50a and the second terminal 50b may be disposed. For example, the multiple terminals may be disposed on the rear surface of the substrate 20 around the switch IC 10. The first terminal 50a and the second terminal 50b are formed, for example, of copper pillars (copper pins), electrodes formed of plating, copper paste, or the like, or solder. The first-surface mounted component 30, the first terminal 50a, and the second terminal 50b are sealed by using a resin 60 onto the rear surface of the substrate 20. The first-surface mounted component 30 is not limited to being sealed onto the rear surface of the substrate 20, and, as described below, may be embedded in the substrate 20.

The switch IC 10 serves as an active element including the first switch unit 11, the amplifying unit 16, and the second switch unit 17 in a base body 10a. The base body 10a is formed, for example, of silicon. The first switch unit 11, the amplifying unit 16, and the second switch unit 17 are embedded in the base body 10a. The first switch unit 11, the amplifying unit 16, and the second switch unit 17 may be disposed on the front surface of the base body. In the base body, the switches 14a to 14d illustrated in FIG. 1 may be embedded.

On the front surface of the substrate 20, a second-surface mounted component 32 is disposed. The second-surface mounted component 32 includes the first matching circuit unit 12, the filter unit 13, and the second matching circuit unit 15. That is, the second-surface mounted component 32 includes the filters 13a to 13g, the inductors 12a to 12g, and the inductors 15a to 15d. The second-surface mounted component is sealed by using a resin 60.

The switch IC 10 is disposed so as to overlap the first matching circuit unit 12 and the filter unit 13 when the substrate 20 is viewed in plan (in a direction perpendicular to the front surface of the substrate 20). The switch IC 10 is disposed so as to overlap the second matching circuit unit 15 when the substrate 20 is viewed in plan. FIG. 1 illustrates the seven inductors 12a to 12g and the four inductors 15a to 15d. The number of inductors may be changed in accordance with the number of bands.

The resin 60 on the front surface of the substrate 20 and the resin 60 on the rear surface may be of the same type or may be of different types. The entirety of both the surfaces of the substrate 20 may be covered by the resins 60. Alternatively, for example, resin such as under filling may be used as a resin 60 to seal only the switch IC 10 on the rear surface of the substrate 20, only the first matching circuit unit 12 on the front surface of the substrate 20, only the filter unit 13, or only the second matching circuit unit 15.

Figure 2B:
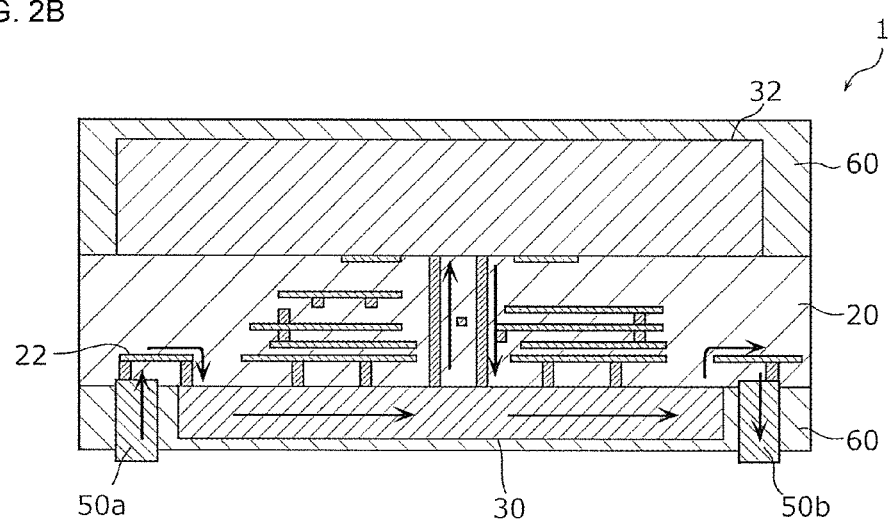
FIG. 2B is a sectional view of a front-end module according to the first embodiment, and is a diagram for describing the flow of a radio-frequency signal.

The flow of a radio-frequency signal in the front-end module 1 will be described. FIG. 2B is a sectional view of the front-end module 1 according to the present embodiment, and is a diagram for describing the flow of a radio-frequency signal.

The front-end module 1 is mounted, for example, on a mother board (not illustrated), and receives a radio-frequency signal from the mother board through the first terminal 50a. The radio-frequency signal flows to the switch 11b of the first switch unit 11 illustrated in FIG. 1, through a wiring line (not illustrated) connecting the first terminal 50a to an input terminal (bump) of the switch IC 10. The radio-frequency signal having passed through the switch 11b flows to the inductors 12a and 12b through wiring lines (via conductors) connecting output terminals (bumps) of the switch 11b to the input terminals (bumps) of the inductors 12a and 12b of the first matching circuit unit 12.

The radio-frequency signal having passed through the inductor 12a flows to the filter unit 13 through a wiring line connecting the output terminal (bump) of the inductor 12a to the input terminal (bump) of the filter 13a of the filter unit 13. The radio-frequency signal having been subjected to filtering by the filter unit 13 flows to the switch 14a through a wiring line (via conductor) connecting an output terminal (bump) of the filter unit 13 to an input terminal (bump) of the switch 14a. The radio-frequency signal having passed through the switch 14a flows to the inductor 15a through a wiring line (via conductor) connecting the output terminal (bump) of the switch 14a to the input terminal of the inductor 15a of the second matching circuit unit 15.

The radio-frequency signal having passed through the inductor 15a flows to the amplifying circuit 16a, which is disposed on the rear surface of the substrate 20, through a via and a wiring line (via conductor) connecting the output terminal of the inductor 15a to the input terminal (bump) of the amplifying circuit 16a of the amplifying unit 16. The radio-frequency signal having been amplified by the amplifying circuit 16a flows to the second switch unit 17 through a wiring line (not illustrated) connecting the output terminal (not illustrated) of the amplifying circuit 16a to an input terminal (not illustrated) of the second switch unit 17.

At that time, in the front-end module 1, a radio-frequency signal flows as illustrated by using the arrows in FIG. 2B: the radio-frequency signal is input to the first terminal 50a disposed on the rear surface of the substrate 20, passes through wiring lines 22 and via conductors 24 in the substrate 20, and is transmitted to the second-surface mounted component 32 disposed on the front surface of the substrate 20; the radio frequency signal having been transmitted to the second-surface mounted component 32 passes from the second-surface mounted component 32 through via conductors 24 and wiring lines 22 in the substrate 20 again, and is output from the second terminal 50b disposed on the rear surface of the substrate 20.

That is, a radio-frequency signal having been input to the first terminal 50a is transmitted to the second-surface mounted component 32, which is disposed on the front surface, from the rear surface of the substrate 20 through wiring lines 22 and via conductors 24 disposed in the substrate 20. Further, the radio-frequency signal is transmitted to the rear surface through wiring lines 22 and via conductors 24 disposed in the substrate 20, and is output from the second terminal 50b.

Thus, a wiring configuration is employed such that a radio-frequency signal which is input to the first terminal 50a is transmitted from the rear surface to the front surface of the substrate 20, and then from the front surface to the rear surface, and is output from the second terminal 50b in a so-called traversable manner, achieving a reduction in the number of wiring lines in the planar direction of the substrate 20 in the front-end module 1. Accordingly, the parasitic capacitance occurring due to wiring lines in the planar direction of the substrate 20 may be reduced. In addition, the reduction in the number of wiring lines in the planar direction of the substrate 20 enables the length of the wiring lines of a path from the first terminal 50a to the second terminal 50b to be made short in the front-end module 1 compared with the case in which the wiring lines are routed on the rear surface and the front surface of the substrate 20. This may suppress the path loss in the front-end module 1.

In addition, the reduction in the number of wiring lines in the planar direction of the substrate 20 makes it easy to do design so that the wiring lines of each radio-frequency path do not overlap those of another radio-frequency path when the substrate 20 is viewed in plan. Therefore, the isolation characteristics may be improved in the radio frequency circuit.

[3. Effects and the Like]

In the front-end module 1 according to the present embodiment, a radio-frequency signal which is input to the first terminal 50a is transmitted from the rear surface of the substrate 20 through wiring lines 22 and via conductors 24, which are disposed in the substrate 20, to the second-surface mounted component 32 disposed on the front surface. Then, the radio-frequency signal is transmitted to the rear surface through wiring lines 22 and via conductors 24 disposed in the substrate 20, and is output from the second terminal 50b. This achieves a reduction in the number of wiring lines in the planar direction of the substrate 20 in the front-end module 1. Accordingly, the parasitic capacitance produced between the wiring lines in the planar direction of the substrate 20 and the ground patterns embedded in the substrate 20 may be reduced. In addition, the reduction in the number of wiring lines in the planar direction of the substrate 20 enables the length of the wiring lines of a path from the first terminal 50a to the second terminal 50b to be made short in the front-end module 1 compared with the case in which the wiring lines are routed on the rear surface and the front surface of the substrate 20. Further, the reduction in the number of wiring lines in the planar direction of the substrate 20 makes it easy to do design so that the wiring lines of each radio-frequency path do not overlap those of another radio-frequency path when the substrate 20 is viewed in plan. Thus, the radio frequency circuit may achieve improvement of the isolation characteristics and suppression of the path loss at the same time.

A configuration may be employed such that the first-surface mounted component 30 includes digital circuit components, and the second-surface mounted component 32 includes analog circuit components. This configuration causes the analog circuit components and the digital circuit components to be spaced apart at least by a distance of the thickness of the substrate 20. Thus, the digital noise, which occurs from the digital circuit components, sneaking to the analog circuit components may be suppressed.

In the case where the digital circuit components and the analog circuit components are separated so as to be disposed on the rear surface and the front surface, respectively, of the substrate 20, the ground for the analog circuit components may be separated from the ground for the digital circuit components. This may more effectively suppress the digital noise, which occurs from the digital circuit components, sneaking to the analog circuit components.

Second Embodiment

Figure 3A:
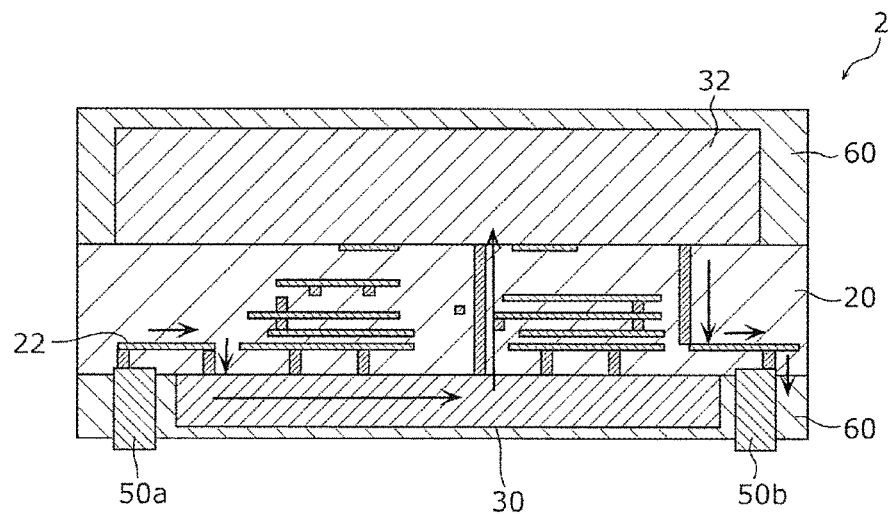
FIG. 3A is a sectional view of a front-end module according to a second embodiment, and is a diagram for describing the flow of a radio-frequency signal.
Figure 3B:
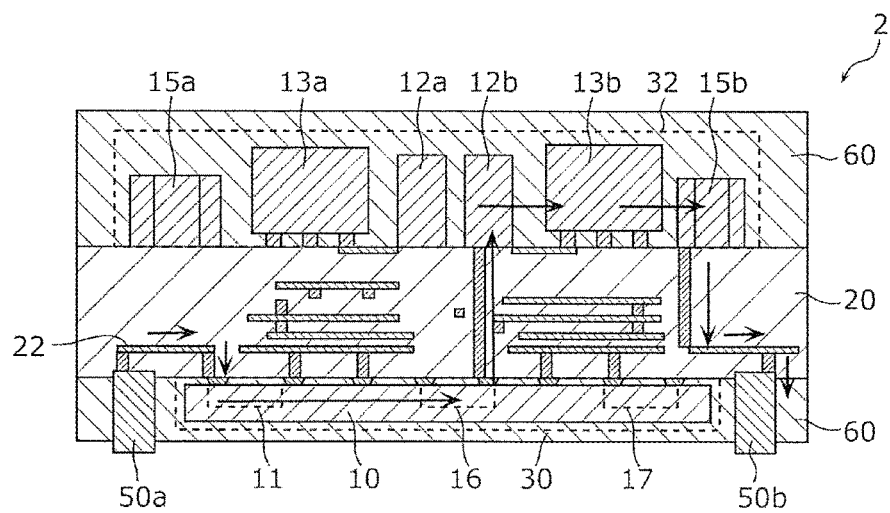
FIG. 3B is a sectional view of a front-end module according to the second embodiment, and is a diagram for describing the flow of a radio-frequency signal.
Figure 3C:
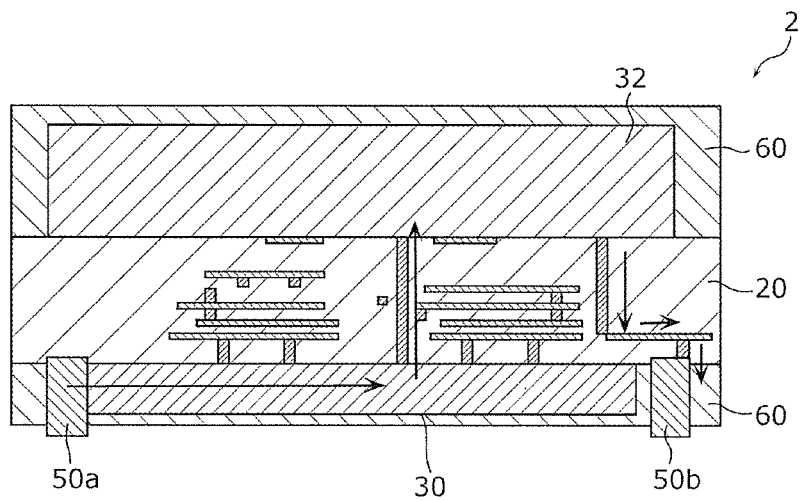
FIG. 3C is a sectional view of a front-end module according to the second embodiment, and is a diagram for describing the flow of a radio-frequency signal.

FIGS. 3A to 3C are sectional views of a front-end module 2 according to a second embodiment, and are diagrams for describing the flows of radio-frequency signals. The arrows illustrated in FIGS. 3A to 3C indicate the flows of radio-frequency signals in the front-end module 2.

The front-end module 2 according to the present embodiment is different from the front-end module 1 according to the first embodiment in that a radio-frequency signal which is input from the first terminal 50a is transmitted through the first terminal 50a, the first-surface mounted component 30, the second-surface mounted component 32, and the second terminal 50b in this sequence.

In detail, as illustrated in FIG. 3A, a radio-frequency signal which is input to the first terminal 50a is transmitted to the first-surface mounted component 30 through a wiring line 22 connecting the first terminal 50a to a terminal (bump) of the first-surface mounted component 30. At that time, a radio-frequency signal may be transmitted from the first terminal 50a through the wiring line 22 in the substrate 20 to the first-surface mounted component 30. Alternatively, as illustrated in FIG. 3C, a radio-frequency signal may be transmitted from the first terminal 50a to the first-surface mounted component 30 through a wiring line, which is disposed on the rear surface of the substrate 20, not through a wiring line 22 in the substrate 20.

The radio-frequency signal, which has been transmitted to the first-surface mounted component 30, is transmitted to the second-surface mounted component 32, which is disposed on the front surface of the substrate 20, through a via conductor 24 extending through between the rear surface and the front surface of the substrate 20. Further, the radio-frequency signal is transmitted from the second-surface mounted component 32 through a via conductor 24 and a wiring line 22 to the second terminal 50b disposed on the rear surface of the substrate 20. Before transmission to the second terminal 50b, the radio-frequency signal may be transmitted to the first-surface mounted component 30 disposed on the rear surface of the substrate 20, and may be then transmitted to the second terminal 50b.

A specific description will be made below. The flow of a radio-frequency signal will be described by focusing on one of the multiple radio-frequency paths included in the front-end module 2. In this example, the radio-frequency path connecting the switch 1ib of the first switch unit 11, the inductor 12b of the first matching circuit unit 12, the filter 13b of the filter unit 13, the inductor 15b of the second matching circuit unit 15, the amplifying circuit 16b of the amplifying unit 16, and the second switch unit 17 will be described.

In the first-surface mounted component 30, as illustrated in FIG. 3B, the radio frequency signal which is input to the first terminal 50a is input to the switch IC 10 disposed in the first-surface mounted component 30. In the switch IC 10, as illustrated in FIG. 1, the radio-frequency signal flows to the switch 11b of the first switch unit 11. Then, the radio-frequency signal having passed through the switch 11b flows to the inductor 12b through a via conductor 24 connecting the output terminal (bump) of the switch 11b to the input terminal (bump) of the inductor 12b of the first matching circuit unit 12.

The radio-frequency signal having passed through the inductor 12b flows to the filter unit 13 through a wiring line connecting the output terminal (bump) of the inductor 12b to the input terminal (bump) of the filter 13b. The radio-frequency signal having been filtered by the filter unit 13 flows to the switch 24b through a wiring line connecting the output terminal (bump) of the filter unit 13 to an input terminal (bump) of the switch 24b. The radio-frequency signal having passed through the switch 24b flows to the inductor 15b through wiring lines connecting the output terminal (bump) of the switch 24b to the input terminal of the inductor 15b of the second matching circuit unit 15.

The radio-frequency signal having passed through the inductor 15b is transmitted to the first-surface mounted component 30, which is disposed on the rear surface of the substrate 20, through a via conductor 24 and a wiring line 22 which connect the output terminal of the inductor 15b to the input terminal (bump) of the amplifying circuit 16b of the amplifying unit 16.

In the second-surface mounted component 32, the radio-frequency signal is transmitted to the amplifying circuit 16b. The radio-frequency signal having been amplified by the amplifying circuit 16b flows to the second switch unit 17 through a wiring line (not illustrated) connecting the output terminal (not illustrated) of the amplifying circuit 16b to the input terminal (not illustrated) of the second switch unit 17. Further, the radio-frequency signal is transmitted, for output, from the second switch unit 17 to the second terminal 50b disposed on the rear surface of the substrate 20.

Thus, a radio-frequency signal which is input to the first terminal 50a flows to the first-surface mounted component 30, which is disposed on the rear surface of the substrate 20, and the second-surface mounted component 32 disposed on the front surface of the substrate 20, and is further transmitted from the second-surface mounted component 32 through the first-surface mounted component 30 to the second terminal 50b.

Thus, the front-end module 2 has such a wiring configuration that the number of wiring lines in the planar direction of the substrate 20 is reduced, and that a radio-frequency signal which is input to the first terminal 50a is transmitted from the rear surface to the front surface of the substrate 20, and then from the front surface to the rear surface in a so-called traversable manner so as to be output from the second terminal 50b. This enables the length of the wiring lines of a path from the first terminal 50a to the second terminal 50b to be made short compared with the case in which the wiring lines are routed on the rear surface and the front surface of the substrate 20. Thus, the radio frequency circuit may achieve improvement of the isolation characteristics and suppression of the path loss at the same time.

Third Embodiment

Figure 4A:
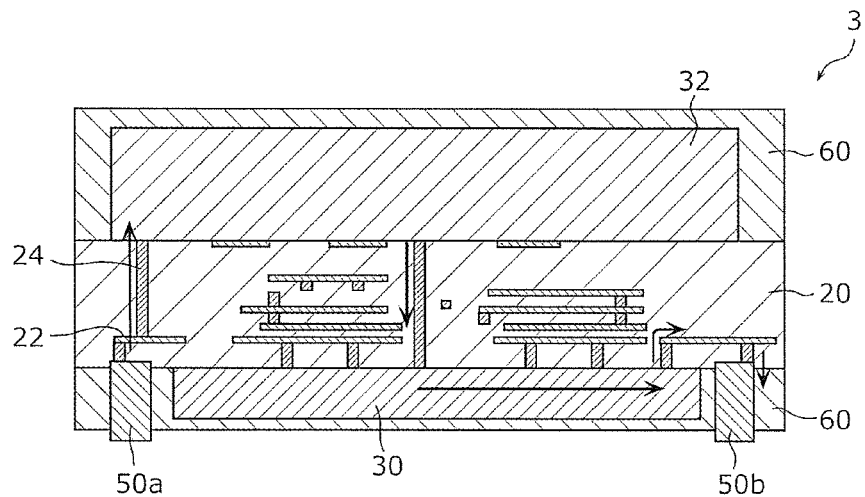
FIG. 4A is a sectional view of a front-end module according to a third embodiment, and is a diagram for describing the flow of a radio-frequency signal.
Figure 4B:
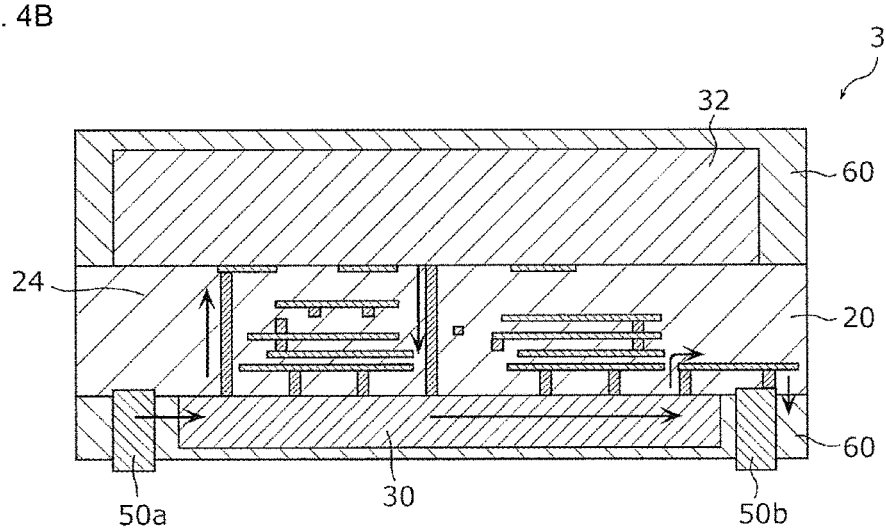
FIG. 4B is a sectional view of a front-end module according to a modified example of the third embodiment, and is a diagram for describing the flow of a radio-frequency signal.

FIG. 4A is a sectional view of a front-end module 3 according to a third embodiment, and is a diagram for describing the flow of a radio-frequency signal. FIG. 4B is a sectional view of a front-end module according to a modified example of the third embodiment, and is a diagram for describing the flow of a radio-frequency signal. The arrows illustrated in FIGS. 4A and 4B indicate the flows of radio-frequency signals in the front-end module 3. The arrangement of the components in the first-surface mounted component 30 and the second-surface mounted component 32 in FIGS. 4A and 4B will not be described.

The front-end module 3 according to the present embodiment is different from the front-end module 1 according to the first embodiment in that a radio-frequency signal is transmitted through the first terminal 50a, the second-surface mounted component 32, the first-surface mounted component 30, and the second terminal 50b in this sequence.

As illustrated in FIG. 4A, a radio-frequency signal which is input to the first terminal 50a is transmitted through a wiring line 22 and a via conductor 24 to the second-surface mounted component 32 disposed on the front surface of the substrate 20. Further, the radio-frequency signal is transmitted from the second-surface mounted component 32 through a via conductor 24 to the first-surface mounted component 30 disposed on the rear surface of the substrate 20. The radio-frequency signal having been transmitted to the first-surface mounted component 30 is transmitted to the second terminal 50b through a wiring line 22 connecting a terminal (bump) of the first-surface mounted component 30 to the second terminal 50b. At that time, the radio-frequency signal may be transmitted from the first-surface mounted component 30 through a wiring line 22 in the substrate 20 to the second terminal 50b. Alternatively, the radio-frequency signal may be transmitted from the first-surface mounted component 30 through a wiring line 22, which is disposed on the rear surface of the substrate 20, to the second terminal 50b. As illustrated in FIG. 4B, before transmission from the first terminal 50a to the second-surface mounted component 32, the radio-frequency signal may be transmitted to the first-surface mounted component 30 disposed on the rear surface of the substrate 20, and may be then transmitted to the second-surface mounted component 32.

Accordingly, the front-end module 3 has such a wiring configuration that the number of wiring lines in the planar direction of the substrate 20 is reduced and that a radio-frequency signal which is input to the first terminal 50a is transmitted from the rear surface to the front surface of the substrate 20, and then from the front surface to the rear surface in a so-called traversable manner, and is output from the second terminal 50b. This enables the length of the wiring lines of a path from the first terminal 50a to the second terminal 50b to be made short compared with the case in which the wiring lines are routed on the rear surface and the front surface of the substrate 20. Therefore, the radio frequency circuit may achieve improvement of the isolation characteristics and suppression of the path loss at the same time.

Fourth Embodiment

Figure 5:
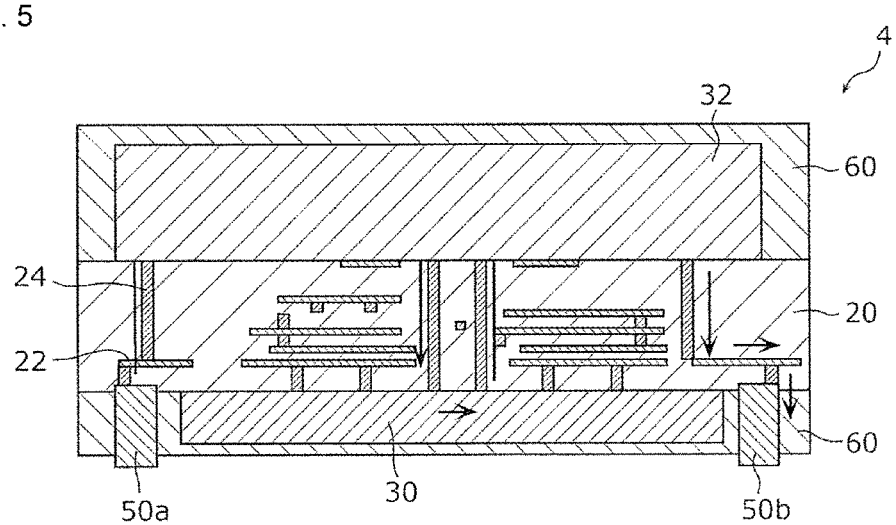
FIG. 5 is a sectional view of a front-end module according to a fourth embodiment, and is a diagram for describing the flow of a radio-frequency signal.

FIG. 5 is a sectional view of a front-end module 4 according to a fourth embodiment, and is a diagram for describing the flow of a radio-frequency signal. The arrows illustrated in FIG. 5 indicate the flow of a radio-frequency signal in the front-end module 4. The arrangement of the components of the first-surface mounted component 30 and the second-surface mounted component 32 in FIG. 5 will not be described.

In the front-end module 4, the number of round trips of a radio-frequency signal between the front surface and the rear surface of the substrate 20 is not limited to one as in the front-end module 1 according to the first embodiment, and may be two or more.

As illustrated in FIG. 5, in the front-end module 4, a radio-frequency signal which is input to the first terminal 50a is transmitted through a wiring line 22 and a via conductor 24 to the second-surface mounted component 32 disposed on the front surface of the substrate 20. Further, the radio-frequency signal is transmitted from the second-surface mounted component 32 through a via conductor 24 to the first-surface mounted component 30 disposed on the rear surface of the substrate 20.

The radio-frequency signal having been transmitted to the first-surface mounted component 30 is transmitted again through a via conductor 24, which extends through between the rear surface and the front surface of the substrate 20, to the second-surface mounted component 32 disposed on the front surface of the substrate 20. Further, the radio-frequency signal is transmitted again from the second-surface mounted component 32 through a via conductor 24 to the first-surface mounted component 30 disposed on the rear surface of the substrate 20.

The radio-frequency signal having been transmitted to the first-surface mounted component 30 is transmitted to the second terminal 50b through a wiring line (not illustrated) connecting a terminal (bump) of the first-surface mounted component 30 to the second terminal 50b. At that time, the radio-frequency signal may be transmitted from the first-surface mounted component 30 through a wiring line 22 in the substrate 20 to the second terminal 50b. Alternatively, the radio-frequency signal may be transmitted from the first-surface mounted component 30 to the second terminal 50b through a wiring line disposed on the rear surface of the substrate 20, not through a wiring line 22 in the substrate 20. Before transmission from the first terminal 50a to the second-surface mounted component 32, the radio-frequency signal may be transmitted to the first-surface mounted component 30 disposed on the rear surface of the substrate 20, and may be then transmitted to the second-surface mounted component 32.

Thus, the front-end module 4 has such a wiring configuration that the number of wiring lines in the planar direction of the substrate 20 is reduced, and that a radio-frequency signal which is input to the first terminal 50a makes round trips between the rear surface and the front surface of the substrate 20 in a so-called traversable manner so, and is transmitted to the second terminal 50b. This enables the length of the wiring lines of a path from the first terminal 50a to the second terminal 50b to be made short compared with the case in which the wiring lines are routed on the rear surface and the front surface of the substrate 20. Therefore, the radio frequency circuit may achieve improvement of the isolation characteristics and suppression of the path loss at the same time.

Fifth Embodiment

Figure 6:
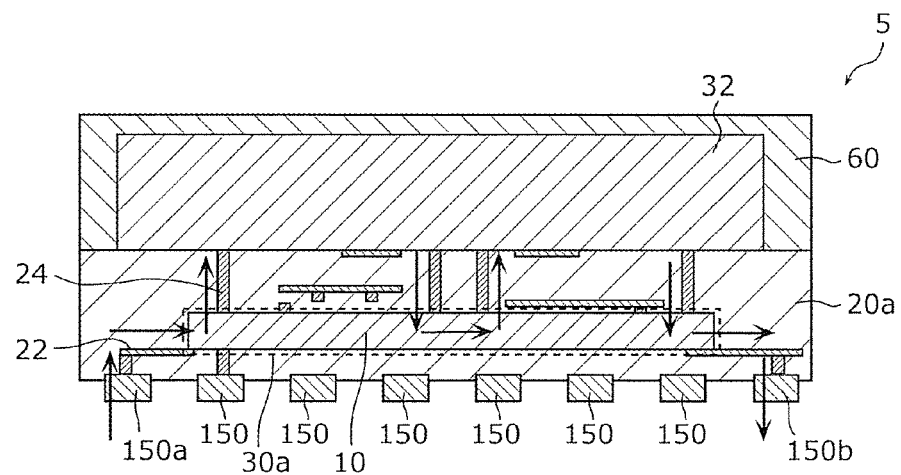
FIG. 6 is a sectional view of a front-end module according to a fifth embodiment, and is a diagram for describing the flow of a radio-frequency signal.

FIG. 6 is a sectional view of a front-end module 5 according to a fifth embodiment, and is a diagram for describing the flow of a radio-frequency signal. The arrows illustrated in FIG. 6 indicate the flow of a radio-frequency signal in the front-end module 5.

In the front-end module 1 described above, the first-surface mounted component 30 including the switch IC 10 is disposed on one of the principal surfaces (for example, the rear surface) of the substrate 20. However, as illustrated as a first-surface mounted component 30a in FIG. 6, the first-surface mounted component may be embedded in a substrate 20a. In the case where the switch IC 10 is embedded in the substrate 20a, the substrate 20a may be a printed circuit board which is easy to be subjected to processing for embedding the switch IC 10. The functions of the front-end module 5 are the same as those of the front-end module 1, and will not be described.

The front-end module 5 illustrated in FIG. 6 includes the first-surface mounted component 30a inside the substrate 20a. Similarly to the first-surface mounted component 30 illustrated in the first embodiment, the switch IC 10 is disposed in the first-surface mounted component 30a. On the rear surface of the substrate 20a, multiple terminals 150 are disposed. One of the multiple terminals 150 is a first terminal 150a, and another one of the multiple terminals 150 is a second terminal 150b. The first terminal 150a is an input terminal for the front-end module 5 receiving a radio-frequency signal, and the second terminal 150b is an output terminal for outputting a radio-frequency signal.

On the front surface of the substrate 20a, the second-surface mounted component 32 is disposed. The configuration of the second-surface mounted component 32 is substantially the same as that of the front-end module 1 illustrated in the first embodiment, and will not be described.

Inside the substrate 20a, multiple wiring lines 22 and via conductors 24 are formed. By using the wiring lines 22 and the via conductors 24, the first-surface mounted component 30a is connected to the first terminal 150a, the second terminal 150b, and the other terminals 150 which are disposed on the rear surface of the substrate 20a. By using the wiring lines 22 and the via conductors 24, the first-surface mounted component 30a is connected to the second-surface mounted component 32 disposed on the front surface of the substrate 20a.

As illustrated in FIG. 6, in the front-end module 5, a radio-frequency signal which is input to the first terminal 150a is transmitted through a wiring line 22 and a via conductor 24, which are disposed in the substrate 20a, to the first-surface mounted component 30a embedded in the substrate 20a. The radio-frequency signal having been transmitted to the first-surface mounted component 30a is transmitted through a via conductor 24 to the second-surface mounted component 32. Further, the radio-frequency signal having been transmitted to the second-surface mounted component 32 is transmitted through a via conductor 24 to the first-surface mounted component 30a embedded in the substrate 20a.

The radio-frequency signal having been transmitted to the first-surface mounted component 30a is transmitted again through a via conductor 24 to the second-surface mounted component 32 disposed on the front surface of the substrate 20. The radio-frequency signal is transmitted again from the second-surface mounted component 32 through a via conductor 24 to the first-surface mounted component 30 embedded in the substrate 20a. The radio-frequency signal having been transmitted to the first-surface mounted component 30a is transmitted to the second terminal 150b through a wiring line (not illustrated) connecting a terminal (bump) of the first-surface mounted component 30a to the second terminal 150b.

Thus, even in the case where the first-surface mounted component 30a is embedded in the substrate 20a, the front-end module 5 has such a wiring configuration that the number of wiring lines in the planar direction of the substrate 20a is reduced, and that a radio-frequency signal which is input to the first terminal 150a is transmitted from the rear surface to the front surface of the substrate 20, and then from the front surface to the rear surface in a so-called traversable manner, and is output from the second terminal 50b. At that time, the front-end module 5 employs the configuration in which a radio-frequency signal makes round trips between the surface, which is closer to the substrate 20a, of the first-surface mounted component 30a and the front surface of the substrate 20a. This enables the length of the wiring lines of a path from the first terminal 50a to the second terminal 50b to be made shorter compared with the case in which the wiring lines are routed on the rear surface and the front surface of the substrate 20. Therefore, the radio frequency circuit may achieve improvement of the isolation characteristics and suppression of the path loss at the same time.

Sixth Embodiment

Figure 7:
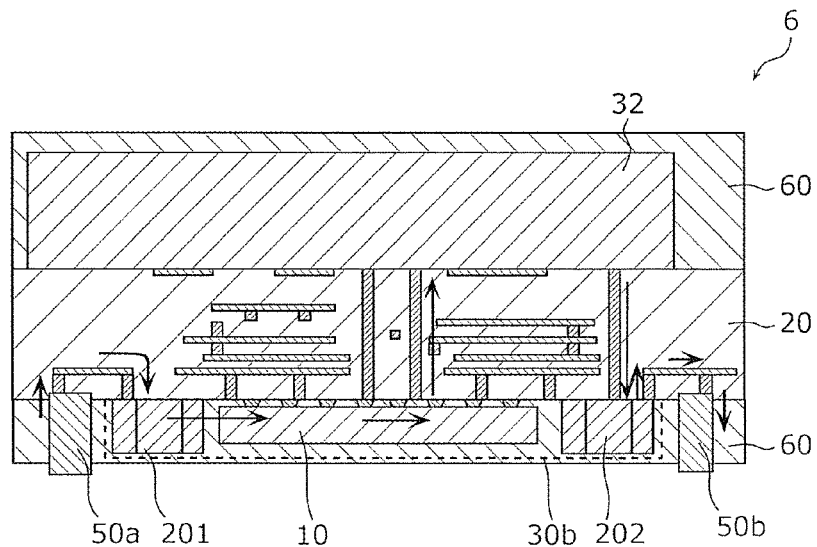
FIG. 7 is a sectional view of a front-end module according to a sixth embodiment, and is a diagram for describing the flow of a radio-frequency signal.

FIG. 7 is a sectional view of a front-end module 6 according to a sixth embodiment, and is a diagram for describing the flow of a radio-frequency signal. The arrows illustrated in FIG. 7 indicate the flow of a radio-frequency signal in the front-end module 6. The arrangement of the components of the second-surface mounted component 32 in FIG. 7 will not be described.

The front-end module 6 according to the present embodiment is different from the front-end module 1 according to the first embodiment in that a first-surface mounted component 30b in the front-end module 6 includes inductors 201 and 202.

That is, as illustrated in FIG. 7, the inductors 201 and 202 are disposed on the rear surface of the substrate 20. The inductor 201 is disposed between the first terminal 50a and the switch IC 10. An antenna device (not illustrated) is connected to the first terminal 50a. Thus, the inductor 201 is connected in series to the path between the first switch unit 11, which is disposed in the switch IC 10, and the antenna device, or is connected between the path and the reference terminal (ground). The inductor 201 is a second matching device for performing matching between the antenna device and the first switch unit 11.

The inductor 202 is disposed between the second terminal 50b and the switch IC 10. A circuit (not illustrated) located downstream of the front-end module 6, such as an RF signal processing circuit (RFIC), is connected to the second terminal 50b. Thus, the inductor 202 is connected in series to the path between the second switch unit 17, which is disposed in the switch IC 10, and the downstream circuit of the front-end module 6, or is connected between the path and the reference terminal. The inductor 202 is a second matching device for performing matching between the downstream circuit of the front-end module 6 and the second switch unit 17.

The second matching devices are not limited to the inductors 201 and 202, and may be capacitors or circuits obtained by combining inductors and capacitors.

A radio-frequency signal which is input from the first terminal 50a passes from the first terminal 50a through the inductor 201 successively, and is transmitted to the first switch unit 11 disposed in the switch IC 10. The radio-frequency signal having been transmitted to the switch IC 10 is transmitted through a wiring line 22 and a via conductor 24, which are disposed in the substrate 20, to the second-surface mounted component 32 disposed on the front surface of the substrate 20. The radio-frequency signal having been transmitted to the second-surface mounted component 32 is transmitted to the first-surface mounted component 30b through a via conductor 24 extending through between the front surface and the rear surface of the substrate 20.

Subsequently, the radio-frequency signal having been transmitted to the first-surface mounted component 30b is transmitted again through a via conductor 24 to the second-surface mounted component 32. The radio-frequency signal is transmitted from the second-surface mounted component 32 through a via conductor 24 to the inductor 202 disposed on the rear surface of the substrate 20. The radio-frequency signal having been transmitted to the inductor 202 passes from the inductor 202 through the second terminal 50b successively, and is output from the second terminal 50b.

Thus, the front-end module 6 has such a wiring configuration that the number of wiring lines in the planar direction of the substrate 20 is reduced, and that a radio-frequency signal which is input to the first terminal 50a is transmitted from the rear surface to the front surface of the substrate 20, and then from the front surface to the rear surface in a so-called traversable manner, and is output from the second terminal 50b. This enables the length of the wiring lines of a path from the first terminal 50a to the second terminal 50b to be made short compared with the case in which the wiring lines are routed on the rear surface and the front surface of the substrate 20. Therefore, the radio frequency circuit may achieve improvement of the isolation characteristics and suppression of the path loss at the same time.

In addition, the front-end module 6 may achieve matching between the antenna device and the first switch unit 11 in the switch IC 10, and matching between the downstream circuit of the front-end module 6 and the second switch unit 17 in the switch IC 10. Thus, the front-end module 6 enables transmission of a radio-frequency signal having a small amount of noise.

Seventh Embodiment

Figure 8:
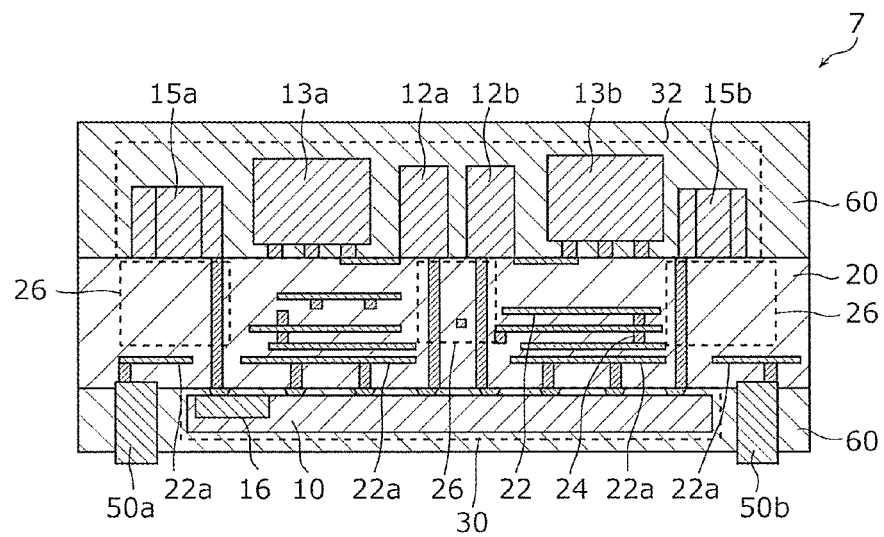
FIG. 8 is a sectional view of a front-end module according to a seventh embodiment.

FIG. 8 is a sectional view of a front-end module 7 according to a seventh embodiment. The arrangement of the components in the first-surface mounted component 30 and the second-surface mounted component 32 in FIG. 8 will not be described.

The front-end module 7 according to the present embodiment is different from the front-end module 1 according to the first embodiment in that ground patterns connected to the ground are not disposed in spaces in the substrate 20 which are located below the inductors 12a, 12b, 15a, and 15b. A ground pattern indicates a wiring pattern, which is connected directly to the ground terminal, among the multiple wiring lines 22 disposed in the substrate 20.

In the front-end module 7, the inductors 15a and 15b are connected to the amplifying circuits 16a to 16d (not illustrated), which are disposed in the amplifying unit 16 disposed in the switch IC 10, through via conductors 24 disposed inside the substrate 20.

As illustrated in FIG. 8, among the wiring lines 22 disposed inside the substrate 20 in the front-end module 7, ground patterns 22a are disposed at positions closest to the rear surface of the substrate 20.

The ground patterns 22a are not disposed in spaces 26, which are located below the inductors 12a, 12b, 15a, and 15b in the substrate 20, and are disposed in spaces other than the spaces 26 which are located below the inductors 12a, 12b, 15a, and 15b in the substrate 20. For example, the ground patterns 22a are not disposed in spaces which are located below the inductors 15a and 15b and which are at least spaces, whose thickness is equal to half of that of the substrate 20 and which extend from the front surface of the substrate 20.

Thus, the parasitic capacitance, which occurs between the ground patterns 22a and the other wiring lines 22 below the inductors 12a, 12b, 15a, and 15b, may be reduced. In particular, the configuration, in which the ground patterns 22a are not disposed in the spaces 26 located below the inductors 15a and 15b connected to the amplifying unit 16 disposed in the switch IC 10, is employed, achieving a reduction in the parasitic capacitance produced between the amplifying unit 16 and the inductors 15a and 15b. Therefore, the change in phase and the influence from the wiring impedance for a radio-frequency signal which is input to the amplifying unit 16 may be reduced. This may suppress degradation in the characteristics of the amplifying circuits (for example, low noise amplifiers) 16a to 16d disposed in the amplifying unit 16.

As illustrated in FIG. 8, the ground patterns 22a are not disposed in spaces inside the substrate 20 which overlap the inductors 12a and 12b in plan view. The inductors 12a and 12b are disposed in spaces which are included in the switch IC 10 in plan view. The inductors 12a and 12b are connected to the switch IC 10 by using via conductors 24, which extend through the substrate 20, in spaces which are included in the switch IC 10 in plan view.

Thus, the inductors 12a and 12b connected to the switch IC 10 may be disposed above the switch IC 10, and the inductors 12a and 12b may be connected to the switch IC 10 through the shortest path by using the substrate 20 and via conductors 24. Accordingly, the change in phase and the influence from the wiring impedance for a radio-frequency signal which is input to the switch IC 10 may be reduced. Therefore, degradation in the characteristics of the amplifying circuits disposed in the switch IC 10 may be suppressed. In particular, in the case of a radio frequency circuit such as a multiplexer in which wiring lines for multiple bands are connected to a common point, the change in phase and the influence from the wiring impedance produced till the common connection point may be reduced, achieving suppression of degradation in the characteristics of the radio frequency circuit.

Eighth Embodiment

The front-end modules 1 to 7 described in the first to seventh embodiments may be applied to a communication apparatus.

Figure 9:
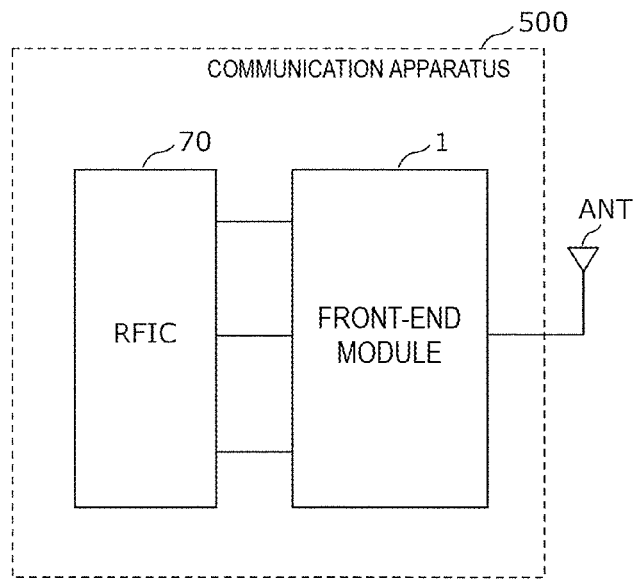
FIG. 9 is a diagram illustrating the configuration of a communication apparatus according to an eighth embodiment.

FIG. 9 is a diagram illustrating the configuration of a communication apparatus 500 according to an eighth embodiment. FIG. 9 illustrates the front-end module 1, an antenna device ANT, and an RF signal processing circuit (RFIC) 70. The front-end module 1 and the RFIC 70 form the communication apparatus 500. The antenna device ANT, the front-end module 1, and the RFIC 70 are disposed, for example, in the front-end unit of a multimode/multiband cellular phone.

The antenna device ANT is a multiband antenna which is based on a communication standard such as LTE and which receives/transmits a radio-frequency signal. The antenna device ANT may be built in in the communication apparatus 500.

The front-end module 1 is a circuit which transmits a radio-frequency signal between the antenna device ANT and the RFIC 70. Specifically, the front-end module 1 transmits a radio-frequency signal, which is received by the antenna device ANT, through a reception-side signal path to the RFIC 70.

The RFIC 70 is an RF signal processing circuit which processes a radio-frequency signal received/transmitted by the antenna device ANT. Specifically, the RFIC 70 performs signal processing, for example, through down-converting, on a radio-frequency signal which is input from the antenna device ANT through a reception-side signal path of the front-end module 1, and outputs the receive signal, which has been generated through the signal processing, to a baseband signal processing circuit (not illustrated).

The communication apparatus 500 includes the front-end module 1. Thus, the communication apparatus 500, which achieves improvement of the isolation characteristics and suppression of the path loss at the same time, may be provided.

The communication apparatus 500 according to the present embodiment includes the front-end module 1. Alternatively, the communication apparatus 500 may include any one of the front-end modules 2 to 7.

Other Embodiments

The front-end modules and the communication apparatus according to the embodiments of the present disclosure are described by taking the first to eighth embodiments. The present disclosure is not limited to the embodiments described above. The present disclosure also encompasses different embodiments implemented by combining any components of the above-described embodiments with each other, and modified examples obtained by making various changes, which are conceived by those skilled in the art without necessarily departing from the gist of the present disclosure, on the embodiments described above.

For example, in the embodiments described above, the first matching circuit unit, the filter unit, and the second matching circuit unit are disposed on a first principal surface (for example, the front surface) of the substrate, and may be alternatively disposed inside the substrate.

For example, the number of switches included in the first switch unit, the number of switches included in the second switch unit, the number of amplifying circuits included in the amplifying unit, the number of filters included in the filter unit, the number of inductors included in the first matching device and the second matching device, which are illustrated in FIG. 1, are exemplary, and are not limiting.

INDUSTRIAL APPLICABILITY

The present disclosure may be used widely in communication equipment such as a cellular phone, as a front-end module and a communication apparatus which may be applied to multiband systems.

REFERENCE SIGNS LIST 1, 2, 3, 4, 5, 6, 7 front-end module (radio frequency circuit)
10 switch IC
10a base body
11 first switch unit
11a, 11b, 11c, 14a, 14b, 14c, 14d, 17a, 17b, 17c, 17d, 17e, 17f, 17g switch (active element)
12 first matching circuit unit
12a, 12b, 12c, 12d, 12e, 12f, 12g, 15a, 15b, 15c, 15d inductor (first matching device)
13 filter unit
13a to 13g filter
15 second matching circuit unit
16 amplifying unit
16a to 16d amplifying circuit (amplifying device, active element)
17 second switch unit
20, 20a substrate
24 via conductor
26 space
30, 30a, 30b first-surface mounted component
32 second-surface mounted component
50a, 150a first terminal
50b, 150b second terminal 60 resin
70 RF signal processing circuit (RFIC)
150 terminal
201, 202 inductor (second matching device)
500 communication apparatus
ANT antenna device

The invention claimed is:

1. A radio frequency circuit comprising:
a substrate;
a first terminal that is disposed on a first principal surface of the substrate;
a second terminal that is disposed on the first principal surface;
a first-surface mounted component that is disposed on the first principal surface or inside the substrate; and
a second-surface mounted component that is disposed on a second principal surface of the substrate, the second principal surface being opposite the first principal surface,
wherein a radio-frequency signal which is input to the first terminal is transmitted from the first principal surface to the second-surface mounted component disposed on the second principal surface and is further transmitted from the second-surface mounted component to the first principal surface through a plurality of wiring lines disposed in the substrate, and is output from the second terminal.

2. The radio frequency circuit according to claim 1,
wherein the radio-frequency signal is transmitted through the first terminal, the first-surface mounted component, the second-surface mounted component, and the second terminal in this sequence.

3. The radio frequency circuit according to claim 2,
wherein the radio-frequency signal is transmitted from the second-surface mounted component to the first-surface mounted component, and then to the second terminal.

4. The radio frequency circuit according to claim 1,
wherein the radio-frequency signal is transmitted through the first terminal, the second-surface mounted component, and the second terminal in this sequence.

5. The radio frequency circuit according to claim 1,
wherein the radio-frequency signal is transmitted through the first terminal, the second-surface mounted component, the first-surface mounted component, and the second terminal in this sequence.

6. The radio frequency circuit according to claim 1,
wherein the first-surface mounted component includes an active element, and
wherein the second-surface mounted component includes a first matching device connected upstream of the active element.

7. The radio frequency circuit according to claim 6,
wherein a ground pattern is disposed in the substrate, and
wherein the ground pattern is disposed so as to overlap the first matching device when the substrate is viewed in plan, and the ground pattern is not disposed in a space in the substrate on a side of the second principal surface, a thickness of the space being half of a thickness of the substrate.

8. The radio frequency circuit according to claim 6,
wherein a ground pattern is disposed in the substrate,
wherein the ground pattern is not disposed in a space which overlaps the first matching device when the substrate is viewed in plan, and
wherein the first matching device is connected to the active element by using a conductor in the space in plan view, and the conductor extends through the substrate.

9. The radio frequency circuit according to claim 6,
wherein the first-surface mounted component includes a second matching device connected to at least one of the first terminal and the second terminal, and
wherein the radio-frequency signal passes successively through at least one of the first terminal and the second terminal, and through the second matching device.

10. A communication apparatus comprising:
an RF signal processing circuit that processes a radio-frequency signal received or transmitted by an antenna device; and
the radio frequency circuit according to claim 1, the radio frequency circuit transmitting the radio-frequency signal between the antenna device and the RF signal processing circuit.

11. The radio frequency circuit according to claim 2,
wherein the first-surface mounted component includes an active element, and
wherein the second-surface mounted component includes a first matching device connected upstream of the active element.

12. The radio frequency circuit according to claim 3,
wherein the first-surface mounted component includes an active element, and
wherein the second-surface mounted component includes a first matching device connected upstream of the active element.

13. The radio frequency circuit according to claim 4,
wherein the first-surface mounted component includes an active element, and
wherein the second-surface mounted component includes a first matching device connected upstream of the active element.

14. The radio frequency circuit according to claim 5,
wherein the first-surface mounted component includes an active element, and
wherein the second-surface mounted component includes a first matching device connected upstream of the active element.

15. A communication apparatus comprising:
an RF signal processing circuit that processes a radio-frequency signal received or transmitted by an antenna device; and
the radio frequency circuit according to claim 2, the radio frequency circuit transmitting the radio-frequency signal between the antenna device and the RF signal processing circuit.

16. A communication apparatus comprising:
an RF signal processing circuit that processes a radio-frequency signal received or transmitted by an antenna device; and
the radio frequency circuit according to claim 3, the radio frequency circuit transmitting the radio-frequency signal between the antenna device and the RF signal processing circuit.

17. A communication apparatus comprising:
an RF signal processing circuit that processes a radio-frequency signal received or transmitted by an antenna device; and
the radio frequency circuit according to claim 4, the radio frequency circuit transmitting the radio-frequency signal between the antenna device and the RF signal processing circuit.

18. A communication apparatus comprising:
an RF signal processing circuit that processes a radio-frequency signal received or transmitted by an antenna device; and the radio frequency circuit according to claim 5, the radio frequency circuit transmitting the radio-frequency signal between the antenna device and the RF signal processing circuit.

19. A communication apparatus comprising:

an RF signal processing circuit that processes a radio-frequency signal received or transmitted by an antenna device; and the radio frequency circuit according to claim 6, the radio frequency circuit transmitting the radio-frequency signal between the antenna device and the RF signal processing circuit.

20. A communication apparatus comprising:

an RF signal processing circuit that processes a radio-frequency signal received or transmitted by an antenna device; and the radio frequency circuit according to claim 7, the radio frequency circuit transmitting the radio-frequency signal between the antenna device and the RF signal processing circuit.

\* \* \* \* \*

UNITED STATES PATENT AND TRADEMARK OFFICE
CERTIFICATE OF CORRECTION

PATENT NO.       : 11,463,050 B2
APPLICATION NO.  : 16/832295
DATED            : October 4, 2022
INVENTOR(S)      : Yusuke Naniwa et al.

It is certified that error appears in the above-identified patent and that said Letters Patent is hereby corrected as shown below:

In the Specification

Column 10, Line 49, "lib" should be -- 11b --.

Signed and Sealed this
Fourth Day of July, 2023

Katherine Kelly Vidal
*Director of the United States Patent and Trademark Office*